United States Patent
Chae

(10) Patent No.: US 11,435,381 B2
(45) Date of Patent: Sep. 6, 2022

(54) NOISE REMOVING CIRCUIT, OPERATION METHOD THEREOF, AND INTEGRATED CIRCUIT INCLUDING THE SAME

(71) Applicant: SK hynix Inc., Icheon-si Gyeonggi-do (KR)

(72) Inventor: Joo Hyung Chae, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/308,458

(22) Filed: May 5, 2021

(65) Prior Publication Data

US 2022/0163574 A1   May 26, 2022

(30) Foreign Application Priority Data

Nov. 26, 2020   (KR) ........................ 10-2020-0160878

(51) Int. Cl.
  *G01R 27/28*   (2006.01)
  *G01R 19/00*   (2006.01)
  *G01R 19/165*   (2006.01)

(52) U.S. Cl.
  CPC ... *G01R 19/0053* (2013.01); *G01R 19/16552* (2013.01)

(58) Field of Classification Search
  CPC .......... G01R 19/0053; G01R 19/16552; H03K 5/1252; H03K 5/19; G06T 5/002
  See application file for complete search history.

(56) References Cited

U.S. PATENT DOCUMENTS

| | | | | |
|---|---|---|---|---|
| 2005/0212528 | A1* | 9/2005 | Kajita | G01R 31/31721 702/191 |
| 2007/0007970 | A1* | 1/2007 | Neuman | G01R 31/31708 324/613 |
| 2011/0025346 | A1* | 2/2011 | Kajita | G01R 29/26 324/613 |
| 2021/0313876 | A1* | 10/2021 | Kumar | H02M 3/33561 |

FOREIGN PATENT DOCUMENTS

| | | |
|---|---|---|
| KR | 100314651 B1 | 8/2002 |
| KR | 1020160136933 A | 11/2016 |
| KR | 1020170047461 A | 5/2017 |

OTHER PUBLICATIONS

Xi Chen et al., "Reference-Noise Compensation Scheme for Single-Ended Package-to-Package Links"; Digest of Technical Papers; Feb. 17, 2020; pp. 126-128; Session 6 / Ultra-High-Speed Wireline / 6.6; 2020 IEEE International Solid-State Circuits Conference.

\* cited by examiner

*Primary Examiner* — Thang X Le
(74) *Attorney, Agent, or Firm* — William Park & Associates Ltd.

(57) ABSTRACT

A noise removing circuit may include: a reference voltage control circuit configured to perform a noise detection sequence operation based on noise detection sequence information, and control a reference voltage based on a counting value; a noise detection circuit configured to compare a supply voltage and the reference voltage, and generate a counting value corresponding to noise which has occurred in the supply voltage; a noise calculation circuit configured to generate a loading control signal corresponding to the noise by performing an operation on the counting value and the reference voltage; and a loading control circuit configured to control a loading value for the supply voltage based on the loading control signal.

16 Claims, 9 Drawing Sheets

NOISE REMOVING CIRCUIT, OPERATION METHOD THEREOF, AND INTEGRATED CIRCUIT INCLUDING THE SAME

CROSS-REFERENCES TO RELATED APPLICATION

The present application claims priority under 35 U.S.C. § 119(a) to Korean application number 10-2020-0160878, filed on Nov. 26, 2020, in the Korean Intellectual Property Office, which is incorporated herein by reference in its entirety.

BACKGROUND

1. Technical Field

Various embodiments generally relate to a noise removing circuit, an operation method thereof, and an integrated circuit including the same, and more particularly, to a noise removing circuit capable of detecting noise which occurs in a supply voltage, an operation method thereof, and an integrated circuit which is driven based on the detection result.

2. Related Art

In general, an integrated circuit including a semiconductor device and a semiconductor memory device receives a supply voltage from the outside, and performs various operations. The integrated circuit includes a driving circuit mounted therein, the driving circuit being configured to perform various functions. The driving circuit also receives the supply voltage, and performs an operation. Therefore, when noise occurs in the supply voltage, the driving circuit may not perform a smooth operation. Furthermore, the integrated circuit may not perform a smooth operation either.

SUMMARY

In an embodiment, a noise removing circuit may include: a reference voltage control circuit, a noise detection circuit, a noise calculation circuit, and a loading control circuit. The reference voltage control circuit may be configured to perform a noise detection sequence operation based on noise detection sequence information, and control a reference voltage based on a counting value. The noise detection circuit may be configured to compare a supply voltage and the reference voltage, and generate a counting value corresponding to noise which has occurred in the supply voltage. The noise calculation circuit may be configured to generate a loading control signal corresponding to the noise by performing an operation on the counting value and the reference voltage. The loading control circuit may be configured to control a loading value for the supply voltage based on the loading control signal.

In an embodiment, an operation method of a noise removing circuit may include the steps of: performing a noise detection sequence operation on a supply voltage; performing an operation on peak voltage information and frequency information on noise detected through the noise detection sequence operation; and controlling a loading value for the supply voltage based on a loading control signal generated in the step of performing the operation on the peak voltage information and the frequency information, and removing noise which has occurred in the supply voltage.

In an embodiment, an integrated circuit may include: a driving circuit, and a noise removing circuit. The driving circuit may be configured to receive a supply voltage and perform a preset operation. The noise removing circuit may include: a reference voltage control circuit, a noise detection circuit, and a loading control circuit. The reference voltage control circuit may be configured to perform a noise detection sequence operation based on noise detection sequence information, and control a reference voltage based on a counting value. The noise detection circuit may be configured to compare the supply voltage and the reference voltage, and generate a counting value corresponding to noise which has occurred in the supply voltage. The noise calculation circuit may be configured to generate a loading control signal corresponding to the noise by performing an operation on the counting value and the reference voltage. The loading control circuit may be configured to control a loading value for the supply voltage based on the loading control signal.

In an embodiment, a noise removing circuit may include: a reference voltage control circuit for performing noise detection using noise detection sequence information, and controlling a reference voltage using a counting value; a noise detection circuit for comparing a supply voltage and the reference voltage, and generating the counting value; and a noise calculation circuit for using the counting value and the reference voltage to provide a loading control signal for removing noise.

DETAILED DESCRIPTION

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of the steps, symbols (e.g., a, b, and c) are used for convenience of description, and the symbols do not describe order of the steps. The steps may be performed in an order different from the order described in the context unless specific order is clearly described in the context. That is, the steps may be performed according to a described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

Various embodiments are directed to a noise removing circuit capable of detecting noise which occurs in a supply voltage, and an operation method thereof Also, various embodiments are directed to an integrated circuit capable of controlling a loading value on a supply voltage according to a detection result generated by a noise removing circuit.

Figure 1:
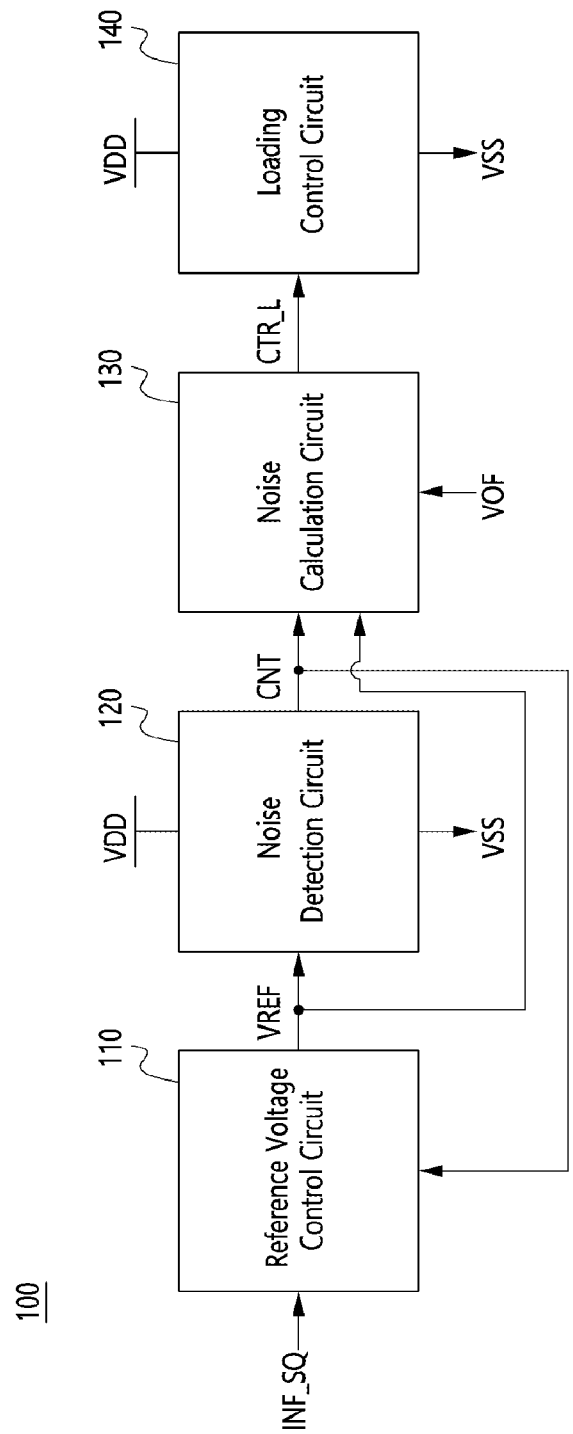
FIG. 1 is a block diagram illustrating a configuration of a noise removing circuit in accordance with an embodiment.

FIG. 1 is a block diagram illustrating a configuration of a noise removing circuit 100 in accordance with an embodiment.

Referring to FIG. 1, the noise removing circuit 100 may include a reference voltage control circuit 110, a noise detection circuit 120, a noise calculation circuit 130 and a loading control circuit 140.

Based on noise detection sequence information INF_SQ, the reference voltage control circuit 110 may be configured to perform a noise detection sequence operation. Although it will be described below again, the noise detection sequence operation may include a first noise detection sequence operation of detecting frequency information based on noise which has occurred in a supply voltage and a second noise detection sequence operation of detecting peak voltage information based on the noise which has occurred in the supply voltage. The peak voltage information based on the noise may indicate the maximum/minimum voltage information of the noise.

In other words, based on the noise detection sequence information INF_SQ, the reference voltage control circuit 110 may perform the first or second noise detection sequence operation. The noise detection sequence information INF_SQ may be a signal provided from a mode register set or a control circuit for controlling the noise removing circuit 100, for example.

Based on a counting value CNT, the reference voltage control circuit 110 may be configured to control a reference voltage VREF. Based on the noise detection sequence information INF_SQ and the counting value CNT, the reference voltage control circuit 110 may control the voltage level of the reference voltage VREF.

More specifically, the reference voltage control circuit 110 may retain the reference voltage VREF at a preset voltage level during the first noise detection sequence operation. During the second noise detection sequence operation, the reference voltage control circuit 110 may increase/decrease the voltage level of the reference voltage VREF. The relationships between the first and second noise detection sequence operations and the voltage level of the reference voltage VREF will be described with reference to FIGS. 4 and 5 below.

The noise detection circuit 120 may be configured to compare the supply voltage and the reference voltage VREF, and generate the counting value CNT corresponding to noise which has occurred in the supply voltage. The supply voltage may include one or more of a power supply voltage VDD and a ground supply voltage VSS. That is, the noise detection circuit 120 may compare one or more of the power supply voltage VDD and the ground supply voltage VSS to the reference voltage VREF. The noise detection circuit 120 may also generate the counting value CNT corresponding to the noise which has occurred in the corresponding supply voltage. For example, when the noise detection circuit 120 detects noise which has occurred in each of the power supply voltage VDD and the ground supply voltage VSS, the reference voltage control circuit 110 may provide the reference voltage VREF corresponding to each of the power supply voltage VDD and the ground supply voltage VSS.

Hereafter, for convenience of description, the following descriptions will be focused on a configuration and operation corresponding to the power supply voltage VDD.

By performing an operation on the counting value .CNT and the reference voltage VREF, the noise calculation circuit 130 may be configured to generate a loading control signal CTR_L corresponding to the noise. During the first noise detection sequence operation, the noise calculation circuit 130 may acquire the counting value CNT and may acquire the reference voltage VREF during the second noise detection sequence operation. Although it will be described below again, the counting value CNT acquired during the first noise detection sequence operation may include frequency information on the noise which has occurred in the power supply voltage VDD. The reference voltage VREF acquired during the second noise detection sequence operation may include peak voltage information on the noise which has occurred in the power supply voltage VDD. Therefore, the loading control signal CTR_L may include the peak voltage information and the frequency information on the noise which has occurred in the power supply voltage VDD.

Additionally, the noise calculation circuit 130 may be configured to receive an offset value VOF with the counting value CNT and the reference voltage VREF, and generate the loading control signal CTR_L. The offset value VOF will be described below with reference to FIG. 9 again.

Based on the loading control signal CTR_L, the loading control circuit 140 may be configured to control a loading value for the supply voltage. As described above, the loading control signal CTR_L may include the peak voltage information and the frequency information on the noise which has occurred in the power supply voltage VDD. Therefore, based on the loading control signal CTR_L, the loading control circuit 140 may remove noise which has occurred in the power supply voltage VDD.

The loading control circuit 140 may be coupled to a driving circuit which receives the supply voltage including the power supply voltage VDD and the ground supply voltage VSS. Therefore, the driving circuit may receive the supply voltage from which the noise has been removed, and perform a smooth operation. This operation will be described with reference to FIG. 9 again.

The noise removing circuit 100 in accordance with the present embodiment may detect the frequency information based on the noise which has occurred in the supply voltage, through the first noise detection sequence operation, and may detect the peak voltage information based on the noise which has occurred in the supply voltage, through the second noise detection sequence operation. The noise removing circuit 100 may perform an operation on the frequency information and the peak voltage information on the noise, thereby removing the noise which has occurred in the supply voltage.

Figure 2:
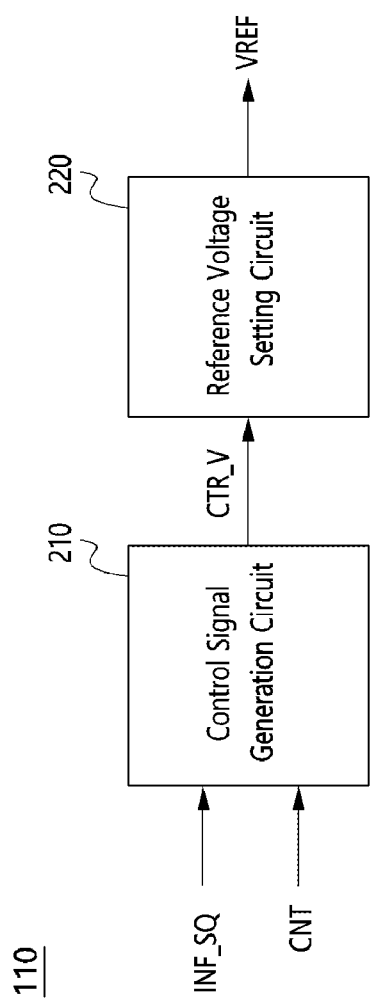
FIG. 2 is a block diagram illustrating a configuration of a reference voltage control circuit of FIG. 1.

FIG. 2 is a block diagram illustrating a configuration of the reference voltage control circuit 110 of FIG. 1.

Referring to FIG. 2, the reference voltage control circuit 110 may include a control signal generation circuit 210 and a reference voltage setting circuit 220.

Based on the noise detection sequence information INF_SQ and the counting value CNT, the control signal generation circuit 210 may be configured to generate a voltage control signal CTR_V. The control signal generation circuit 210 may generate the voltage control signal CTR_V for generating the reference voltage VREF at a preset voltage level during the first noise detection sequence operation. Furthermore, based on the counting value CNT, the control signal generation circuit 210 may generate the voltage control signal CTR_V for generating the reference voltage VREF, which is increased/decreased, during the second noise detection sequence operation.

Based on the voltage control signal CTR_V, the reference voltage setting circuit 220 may be configured to set the voltage level of the reference voltage VREF. As described above, the reference voltage VREF may retain the preset voltage level during the first noise detection sequence operation. Based on the voltage control signal CTR_V during the second noise detection sequence operation, the voltage level of the reference voltage VREF may be increased/decreased.

Figure 3:
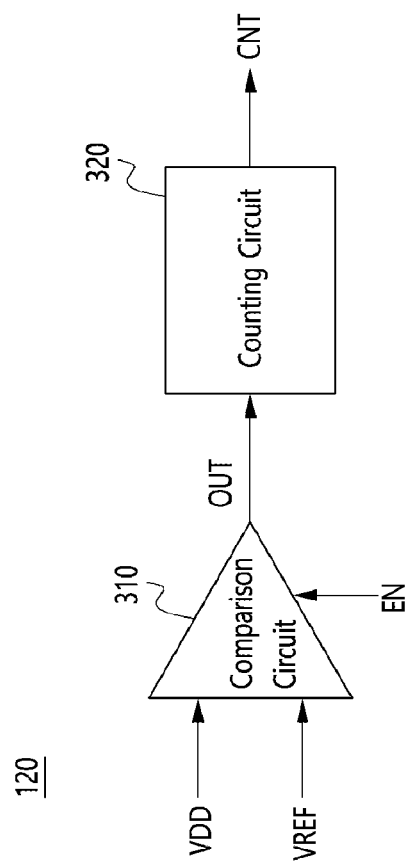
FIG. 3 is a block diagram illustrating a configuration of a noise detection circuit of FIG. 1.

FIG. 3 is a block diagram illustrating a configuration of the noise detection circuit 120 of FIG. 1.

The noise detection circuit 120 of FIG. 3 may include a comparison circuit 310 and a counting circuit 320.

The comparison circuit 310 may be configured to compare the power supply voltage VDD and the reference voltage VREF. Based on an interval in which the power supply voltage VDD becomes lower than the reference voltage VREF, the comparison circuit 310 may generate an output signal OUT. That is, the output signal OUT may include a pulse corresponding to the interval in which the power supply voltage VDD becomes lower than the reference voltage VREF. The operation of the comparison circuit 310 will be described with reference to FIGS. 4 and 5. Additionally, based on an interval in which the power supply voltage VDD becomes higher than the reference voltage VREF, depending on design, the comparison circuit 310 may generate the output signal OUT. That is, the output signal OUT may include a pulse corresponding to the interval in which the power supply voltage VDD becomes higher than the reference voltage VREF.

Based on an enable signal EN, the comparison circuit 310 may define whether to enable a comparison operation. That is, the comparison circuit 310 may perform the comparison operation during an interval in which the enable signal EN is activated to logic 'high', for example.

By counting the output signal OUT of the comparison circuit 310, the counting circuit 320 may be configured to generate the counting value CNT. For example, in order to express the number of pulses included in the output signal OUT, the counting value CNT may be designed in a code type.

Figure 4:
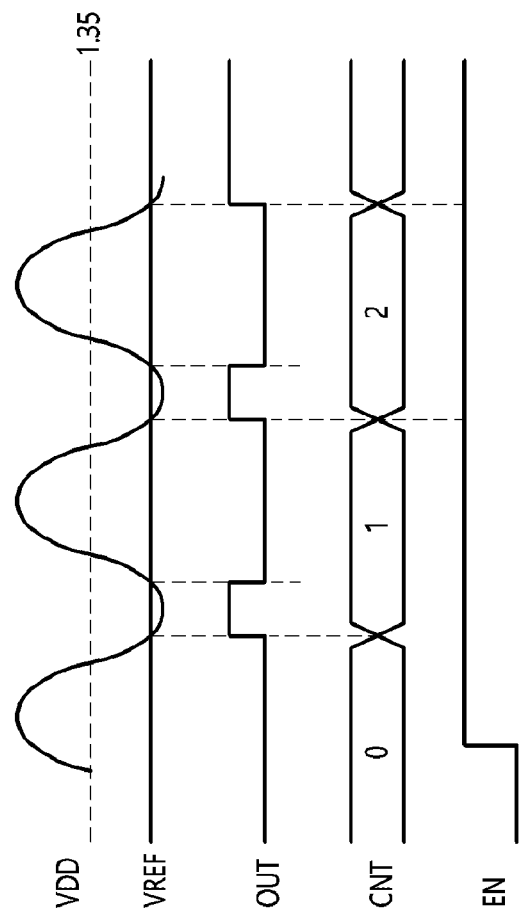
FIG. 4 is a waveform diagram illustrating a first noise detection sequence operation of the noise detection circuit of FIG. 3.

FIG. 4 is a waveform diagram illustrating the first noise detection sequence operation of the noise detection circuit 120 of FIG. 3. FIG. 4 schematically illustrates operation waveforms corresponding to the power supply voltage VDD, the reference voltage VREF, the output signal OUT, the counting value CNT and the enable signal EN.

Referring to FIGS. 3 and 4, the power supply voltage VDD may have a target voltage level of 1.35 V, for example. At this time, due to noise, the voltage level of the power supply voltage VDD may become higher or lower than 1.35 V. During the first noise detection sequence operation, the reference voltage VREF may retain a preset voltage level.

The comparison circuit 310 of FIG. 3 may compare the power supply voltage VDD and the reference voltage VREF. The comparison circuit 310 may output a pulse signal that transitions in an interval in which the power supply voltage VDD becomes lower than the reference voltage VREF. By counting the number of pulses included in the output signal OUT, the counting circuit 320 may generate the counting value CNT.

The comparison circuit 310 may perform the comparison operation in an interval in which the enable signal EN is logic 'high', and generate the output signal OUT. Based on the output signal OUT of the comparison circuit 310, the counting circuit 320 may generate the counting value CNT. Therefore, the information corresponding to the interval in which the enable signal EN is logic 'high' and the counting value CNT during the corresponding interval may include frequency information on the noise which has occurred in the power supply voltage VDD. Thus, the noise calculation circuit 130 of FIG. 1 may acquire the frequency information based on the noise, which has occurred in the power supply voltage VDD, based on the counting value CNT which is generated during the interval in which the enable signal EN is activated, during the first noise detection sequence operation.

Figure 5:
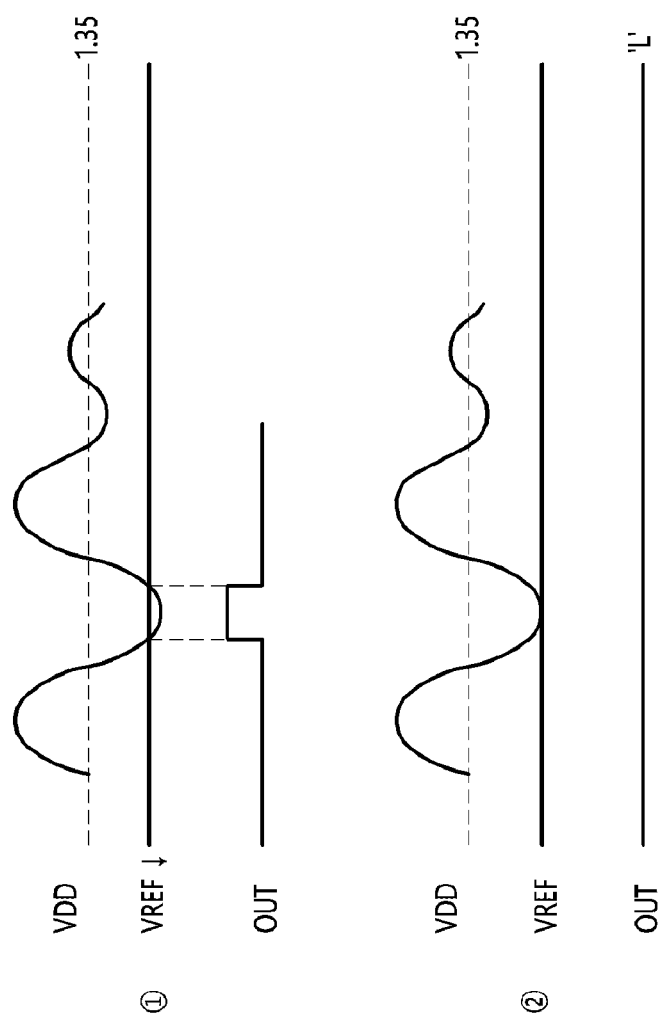
FIG. 5 is a waveform diagram illustrating a second noise detection sequence operation of the reference voltage control circuit of FIG. 2 and the noise detection circuit of FIG. 3.

FIG. 5 is a waveform diagram illustrating the second noise detection sequence operation of the reference voltage control circuit 110 of FIG. 2 and the noise detection circuit 120 of FIG. 3. FIG. 5 schematically illustrates operation waveforms corresponding to the power supply voltage VDD, the reference voltage VREF and the output signal OUT.

Referring to FIGS. 2, 3 and 5, the power supply voltage VDD may have a target voltage level of 1.35 V, for example. At this time, the voltage level of the power supply voltage VDD may become higher or lower than 1.35 V due to noise.

The reference voltage VREF during the second noise detection sequence operation may have a voltage level which is initially set as indicated by ① in FIG. 5. At this time, the output signal OUT of FIG. 3 may include pulses. Although not illustrated, the counting value CNT may be generated by counting the number of pulses. The control signal generation circuit 210 of FIG. 2 may generate the voltage control signal CTR_V based on the counting value CNT. Based on the voltage control signal CTR_V, the reference voltage setting circuit 220 may gradually lower the voltage level of the reference voltage VREF. When the voltage level of the reference voltage VREF is gradually lowered as indicated by ② in FIG. 5, no pulses may be included in the output signal OUT. When no pulses are included in the output signal OUT, the counting value CNT may retain a logic 'low' level. The control signal generation circuit 210 may clamp the voltage control signal CTR_V based on the counting value CNT which retains a logic 'low' level.

Based on the clamped voltage control signal CTR_V, the reference voltage setting circuit 220 of FIG. 2 may generate the reference voltage VREF. At this time, the reference voltage VREF may include the minimum voltage level of the noise which has occurred in the power supply voltage VDD. Therefore, the noise calculation circuit 130 of FIG. 1 may acquire the minimum voltage information as peak voltage information based on the noise which has occurred in the power supply voltage VDD, based on the reference voltage VREF generated during the second noise sequence operation.

As described with reference to FIGS. 4 and 5, the noise removing circuit in accordance with the present embodiment may acquire the frequency information on the noise which has occurred in the power supply voltage VDD, through the first noise detection sequence operation, and may acquire the minimum voltage information based on the noise which has occurred in the power supply voltage VDD, through the second noise detection sequence operation.

Figure 6:
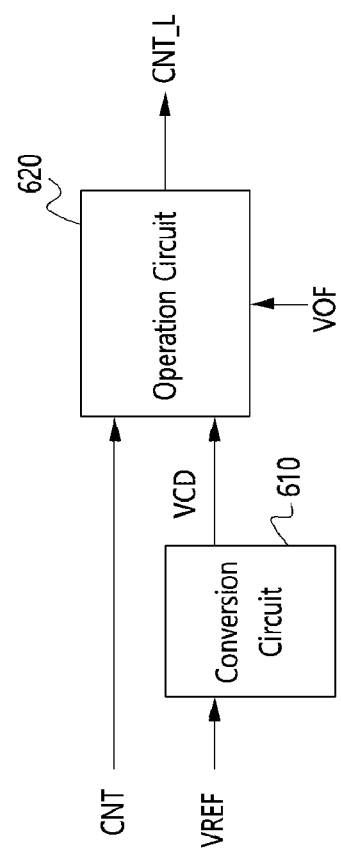
FIG. 6 is a block diagram illustrating a configuration of a noise calculation circuit of FIG. 1.

FIG. 6 is a block diagram illustrating a configuration of the noise calculation circuit 130 of FIG. 1.

Referring to FIG. 6, the noise calculation circuit 130 may include a conversion circuit 610 and an operation circuit 620.

The conversion circuit 610 may be configured to convert the reference voltage VREF into an operation type voltage corresponding to the counting value CNT. For example, as described above, the reference voltage VREF may be designed in a code type. Therefore, the conversion circuit 610 may convert the reference voltage VREF into a code-type voltage. The conversion circuit 610 may be implemented as an analog-digital converter.

By performing an operation on an output value VCD of the conversion circuit 610 and the counting value CNT, the operation circuit 620 may be configured to generate the loading control signal CTR_L. As described above, the counting value CNT may include the frequency information on the noise which has occurred in the power supply voltage VDD, and the output value VCD corresponding to the reference voltage VREF may include the minimum voltage information on the noise which has occurred in the power supply voltage VDD. Therefore, the operation circuit 620 may generate the loading control signal CTR_L by performing an operation based on the minimum voltage information and the frequency information based on the noise which has occurred in the power supply voltage VDD.

Additionally, by performing an operation on the counting value CNT, the output value VCD and the offset value VOF, the operation circuit 620 may generate the loading control signal CTR_L. The offset value VOF may be designed in a code type like the counting value CNT and the output value VCD. The offset value VOF will be described below with reference to FIG. 9 again.

As described with reference to FIG. 5, based on the voltage control signal CTR_V, the reference voltage setting circuit 220 of FIG. 2 may gradually lower the voltage level of the reference voltage VREF. On the contrary, based on the voltage control signal CTR_V, the reference voltage setting circuit 220 may gradually raise the voltage level of the reference voltage VREF. When the voltage level of the reference voltage VREF is gradually raised to perform the second noise detection sequence operation, the noise calculation circuit 130 of FIG. 1 may acquire the maximum voltage information as the peak voltage information based on the noise which has occurred in the power supply voltage VDD.

In short, the noise removing circuit in accordance with the present embodiment may acquire the maximum/minimum voltage information as the peak voltage information based on the noise which has occurred in the power supply voltage VDD, during the second noise detection sequence operation.

The noise removing circuit 100 in accordance with the embodiment, which has been described with reference to FIGS. 2 to 6, may, based on the noise which has occurred in the power supply voltage VDD, acquire the frequency information and the peak voltage information. Additionally, the noise removing circuit 100 may acquire the frequency information and the peak voltage information based on the noise which has occurred in the ground supply voltage VSS other than the power supply voltage VDD.

In short, based on the noise which has occurred in each of the power supply voltage VDD and the ground supply voltage VSS. the noise removing circuit in accordance with the present embodiment may acquire the frequency information and the peak voltage information. Based on the noise which has occurred in each of the power supply voltage VDD and the ground supply voltage VSS, the noise calculation circuit 130 of FIG. 6 may generate the loading control signal CTR_L based on the peak voltage information and the frequency information.

Hereafter, for convenience of description, the loading control signal CTR_L corresponding to the power supply voltage VDD will be referred to as 'first loading control signal', and represented by 'CTR_L1'. Furthermore, the loading control signal CTR_L corresponding to the ground supply voltage VSS will be referred to as 'second loading control signal', and represented by 'CTR_L2'.

Figure 7:
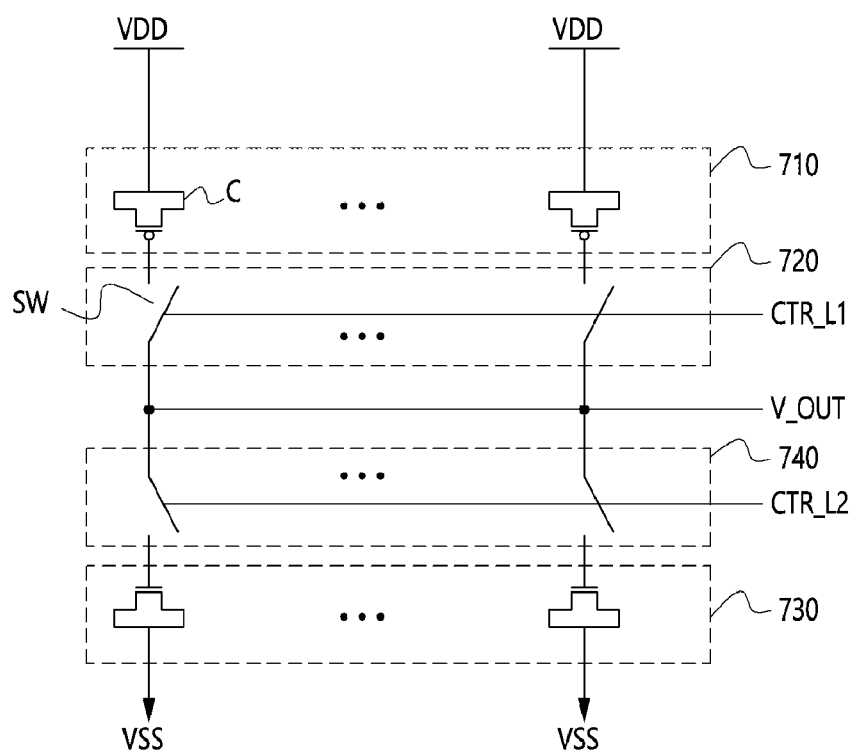
FIG. 7 is a circuit diagram illustrating a configuration of a loading control circuit of FIG. 1.

FIG. 7 is a circuit diagram illustrating a configuration of the loading control circuit 140 of FIG. 1.

Referring to FIG. 7, the loading control circuit 140 may include a plurality of loading circuits 710 and 730 and a plurality of switching circuits 720 and 740.

The plurality of loading circuits 710 and 730 may be configured to receive the supply voltage. The plurality of loading circuits 710 and 730 may include a plurality of first loading circuits 710 corresponding to the power supply voltage VDD and a plurality of second loading circuits 730 corresponding to the ground supply voltage VSS.

The plurality of switching circuits 720 and 740 may include a plurality of first switching circuits 720 corresponding to the plurality of first loading circuits 710 and a plurality of second switching circuits 740 corresponding to the plurality of second loading circuits 730. The plurality of first switching circuits 720 may be configured to selectively couple the respective first loading circuits 710 to an output terminal V_OUT based on the first loading control signal CTR_L1. Based on the second loading control signal CTR_L2, the plurality of second switching circuits 740 may be configured to selectively couple the respective second loading circuits 730 to the output terminal V_OUT.

More specifically, the plurality of first loading circuits 710 may include a plurality of capacitors C configured to receive the power supply voltage VDD. The plurality of first switching circuits 720 may include a plurality of switches SW configured to selectively couple the respective capacitors C to the output terminal V_OUT based on the first loading control signal CTR_L1. The first loading control signal CTR_L1 may be defined according to the number of switches SW included in the plurality of first loading circuits 710. Therefore, the loading control circuit 140 of FIG. 7 may remove the noise which has occurred in the power supply voltage VDD, through the configuration for the plurality of first loading circuits 710 and the plurality of first switching circuits 720.

The plurality of second loading circuits 730 and the plurality of second switching circuits 740 may be components corresponding to the ground supply voltage VSS. The loading control circuit 140 of FIG. 7 may remove the noise which has occurred in the ground supply voltage VSS, through the configuration for the plurality of second loading circuits 730 and the plurality of second switching circuits 740.

The noise removing circuit in accordance with the embodiment may remove the noise which has occurred in each of the power supply voltage VDD and the ground supply voltage VSS, through the first and second noise detection sequence operations.

Figure 8:
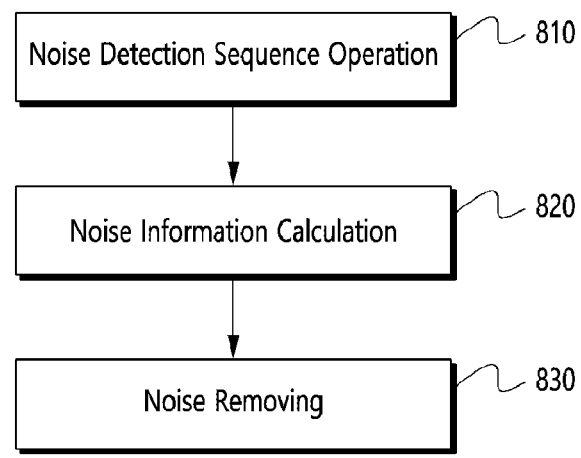
FIG. 8 is a flowchart illustrating an operation method of a noise removing circuit in accordance with an embodiment.

FIG. 8 is a flowchart illustrating an operation method of a noise removing circuit in accordance with an embodiment.

Referring to FIG. 8, the operation method of the noise removing circuit may include a noise detection sequence operation step S810, a noise information calculation step S820 and a noise removing step S830.

Based on the supply voltage, the noise detection sequence operation step S810 may include performing a noise detection sequence operation. As described above, the noise detection sequence operation may include the first noise detection sequence operation and the second noise detection sequence operation. Based on noise which has occurred in the supply voltage, the first noise detection sequence operation may indicate an operation of detecting frequency information. The second noise detection sequence operation may indicate an operation of detecting peak voltage information based on noise which has occurred in the supply voltage.

As already described with reference to FIGS. 1 to 5, the noise removing circuit 100 may generate the counting value CNT by comparing and counting the supply voltage and the reference voltage VREF during the interval in which the enable signal EN is activated during the first noise detection sequence operation. Based on the counting value CNT which is generated during the active interval of the enable signal EN, the noise removing circuit may detect the frequency information on the noise which has occurred on the supply voltage.

By comparing and counting the supply voltage and the reference voltage VREF during the interval in which the enable signal EN is activated during the first noise detection sequence operation, as already described with reference to FIGS. 1 to 5, the noise removing circuit 100 may generate the counting value CNT. Based on the counting value CNT which is generated during the active interval of the enable signal EN, the noise removing circuit may detect the frequency information on the noise which has occurred on the supply voltage.

During the second noise detection sequence operation, by comparing and counting the supply voltage and the reference voltage VREF, the noise removing circuit 100 may generate the counting value CNT. The noise removing circuit 100 may increase/decrease and clamp the voltage level of the reference voltage VREF. The noise removing circuit 100 may detect the peak voltage information based on the noise which has occurred in the supply voltage, based on the clamped reference voltage VREF.

Figure 9:
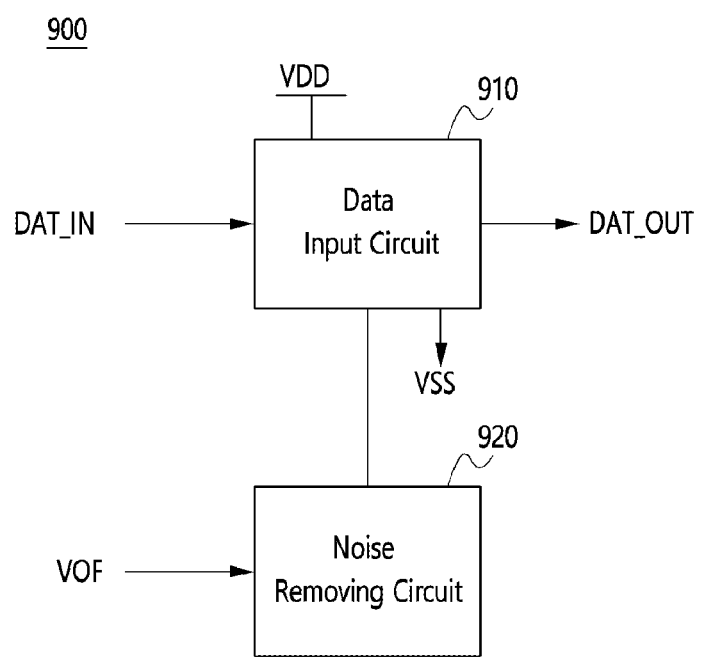
FIG. 9 is a block diagram illustrating a configuration of an integrated circuit in accordance with an embodiment.

FIG. 9 is a block diagram illustrating a configuration of an integrated circuit 900 in accordance with an embodiment.

Referring to FIG. 9, the integrated circuit 900 may include a data input circuit 910 and a noise removing circuit 920.

The data input circuit 910 may be configured to receive the power supply voltage VDD and the ground supply voltage VSS, and receive input data DAT_IN and generate output data DAT_OUT. The data input circuit 910 may be an example of a driving circuit which receives the supply voltage including the power supply voltage VDD and the ground supply voltage VSS, and performs a preset operation. As described with reference to FIGS. 1 to 8, the noise removing circuit 920 may correspond to the noise removing circuit 100.

The integrated circuit in accordance with the present embodiment may remove the noise which has occurred in each of the power supply voltage VDD and the ground supply voltage VSS, which are applied to the driving circuit, for example, such as the data input circuit 910.

Based on the offset value VOF, the noise removing circuit 920 may generate the loading control signal CTR_L. The offset value VOF may include the circuit characteristics of the data input circuit 910. The circuit characteristics of the data input circuit 910, such as a PVT (Process, Voltage, Temperature) variation, a control range and a control interval, may be changed depending on circuit design. The offset value VOF may include such circuit characteristics.

In this connection, referring back to FIG. 6, by performing an operation on the counting value CNT, the output value VCD and the offset value VOF, the operation circuit 620 may generate the loading control signal CTR_L. Therefore, the offset value VOF for the data input circuit 910 of FIG. 9 may be reflected into the loading control signal CTR_L.

The integrated circuit in accordance with the present embodiment may reflect the offset value VOF of the driving circuit, for example, the data input circuit 910, and thus remove the noise which has occurred in the supply voltage.

In accordance with the present embodiments, it is possible to stably detect noise which has occurred in a supply voltage, thereby accurately removing noise.

Furthermore, it is possible to remove noise which has occurred in a supply voltage, thereby guaranteeing a smooth circuit operation of the integrated circuit which receives the supply voltage.

While various embodiments have been described above, it will be understood to those skilled in the art that the embodiments described are examples only. Accordingly, the noise removing circuit, the operation method and the integrated circuit, which have been described herein, should not be limited based on the described embodiments.

What is claimed is:

1. A noise removing circuit comprising:
   a reference voltage control circuit configured to perform a noise detection sequence operation based on noise detection sequence information, and control a reference voltage based on a counting value;
   a noise detection circuit configured to compare a supply voltage and the reference voltage, and generate the counting value corresponding to noise which has occurred in the supply voltage;

a noise calculation circuit configured to generate a loading control signal corresponding to the noise by performing an operation on the counting value and the reference voltage; and a loading control circuit configured to control a loading value for the supply voltage based on the loading control signal.

2. The noise removing circuit according to claim 1, wherein the noise detection sequence operation comprises a first noise detection sequence operation of detecting frequency information on the noise which has occurred in the supply voltage and a second noise detection sequence operation of detecting peak voltage information on the noise which has occurred in the supply voltage.

3. The noise removing circuit according to claim 1, wherein the reference voltage control circuit retains the reference voltage at a preset voltage level or increases/decreases the voltage level of the reference voltage, based on the noise detection sequence information.

4. The noise removing circuit according to claim 1, wherein the reference voltage control circuit comprises:

a control signal generation circuit configured to generate a voltage control signal based on the noise detection sequence information and the counting value; and a reference voltage setting circuit configured to set the voltage level of the reference voltage based on the voltage control signal.

5. The noise removing circuit according to claim 1, wherein the noise detection circuit comprises:

a comparison circuit configured to define whether to perform an enable operation based on an enable signal, and to compare the supply voltage and the reference voltage; and a counting circuit configured to generate the counting value by counting an output signal of the comparison circuit.

6. The noise removing circuit according to claim 1, wherein the noise calculation circuit comprises:

a conversion circuit configured to convert the reference voltage into an operation type corresponding to the counting value; and an operation circuit configured to generate the loading control signal by performing an operation on an output value of the conversion circuit and the counting value.

7. The noise removing circuit according to claim 1, wherein the loading control circuit comprises:

a plurality of loading circuits configured to receive the supply voltage; and a plurality of switching circuits configured to selectively couple the respective loading circuits to an output terminal, based on the loading control signal.

8. An operation method of a noise removing circuit, comprising the steps of:

performing a noise detection sequence operation on a supply voltage;

performing an operation on peak voltage information and frequency information on noise detected through the noise detection sequence operation; and controlling a loading value for the supply voltage based on a loading control signal generated in the step of performing the operation on the peak voltage information and the frequency information, and removing noise which has occurred in the supply voltage.

9. The operation method according to claim 8, wherein the noise detection sequence operation comprises a first noise detection sequence operation of detecting the frequency information and a second noise detection sequence operation of detecting the peak voltage information.

10. The operation method according to claim 9, wherein the first noise detection sequence operation comprises the steps of:

generating a counting value by comparing and counting the supply voltage and a reference voltage during a preset active interval; and detecting the frequency information based on the counting value generated in the active interval.

11. The operation method according to claim 9, wherein the second noise detection sequence operation comprises the steps of:

generating a counting value by comparing and counting the supply voltage and a reference voltage;

increasing/decreasing and clamping the voltage level of the reference voltage based on the counting value; and detecting the peak voltage information based on the clamped reference voltage.

12. An integrated circuit comprising:

a driving circuit configured to receive a supply voltage and perform a preset operation; and a noise removing circuit comprising: a reference voltage control circuit configured to perform a noise detection sequence operation based on noise detection sequence information, and control a reference voltage based on a counting value; a noise detection circuit configured to compare the supply voltage and the reference voltage, and generate a counting value corresponding to noise which has occurred in the supply voltage; a noise calculation circuit configured to generate a loading control signal corresponding to the noise by performing an operation on the counting value and the reference voltage; and a loading control circuit configured to control a loading value for the supply voltage based on the loading control signal.

13. The integrated circuit according to claim 12, wherein the noise detection sequence operation comprises a first noise detection sequence operation of detecting frequency information on the noise which has occurred in the supply voltage and a second noise detection sequence operation of detecting peak voltage information on the noise which has occurred in the supply voltage.

14. The integrated circuit according to claim 12, wherein the noise calculation circuit generates the loading control signal based on an offset value of the driving circuit.

15. The integrated circuit according to claim 14, wherein the noise calculation circuit comprises:

a conversion circuit configured to convert the reference voltage into an operation type corresponding to the counting value; and an operation circuit configured to generate the loading control signal by performing an operation on an output value of the conversion circuit, the counting value and the offset value.

16. A noise removing circuit comprising:

a reference voltage control circuit for performing noise detection using noise detection sequence information, and controlling a reference voltage using a counting value;

a noise detection circuit for comparing a supply voltage and the reference voltage, and generating the counting value; and a noise calculation circuit for using the counting value and the reference voltage to provide a loading control signal for removing noise.

* * * * *